United States Patent
Adachi et al.

(10) Patent No.: US 11,217,832 B2
(45) Date of Patent: Jan. 4, 2022

(54) POWER SUPPLY SYSTEM

(71) Applicant: DENSO CORPORATION, Kariya (JP)

(72) Inventors: Norikazu Adachi, Kariya (JP); Tomoki Yamane, Kariya (JP); Takao Suenaga, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 16/815,082

(22) Filed: Mar. 11, 2020

(65) Prior Publication Data

US 2020/0212511 A1 Jul. 2, 2020

Related U.S. Application Data

(63) Continuation of application No. PCT/JP2018/031675, filed on Aug. 28, 2018.

(30) Foreign Application Priority Data

Sep. 11, 2017 (JP) .............................. JP2017-174288

(51) Int. Cl.
| | |
|---|---|
| *H01M 10/44* | (2006.01) |
| *G01R 31/392* | (2019.01) |
| *H02J 7/00* | (2006.01) |
| *G01R 31/36* | (2020.01) |
| *H01M 4/587* | (2010.01) |
| *H01M 10/0525* | (2010.01) |
| *H01M 10/42* | (2006.01) |

(Continued)

(52) U.S. Cl.
CPC ........ *H01M 10/44* (2013.01); *G01R 31/3648* (2013.01); *G01R 31/392* (2019.01); *H01M 4/587* (2013.01); *H01M 10/0525* (2013.01); *H01M 10/425* (2013.01); *H01M 10/48* (2013.01); *H02J 7/0047* (2013.01); *H02J 7/007182* (2020.01); *H01M 2004/027* (2013.01); *H01M 2010/4271* (2013.01)

(58) Field of Classification Search
CPC ............ H01M 10/44; H01M 10/0525; H01M 10/425; H01M 10/48; H01M 2010/4271; G01R 31/392; G01R 31/3648; H02J 7/007182; H02J 7/0047
USPC ........................................................ 320/134
See application file for complete search history.

(56) References Cited

U.S. PATENT DOCUMENTS

| | | | |
|---|---|---|---|
| 10,338,144 B2 * | 7/2019 | Sugiyama ............ | G01R 31/382 |
| 2018/0175461 A1 * | 6/2018 | Nam ..................... | H02J 7/0091 |

FOREIGN PATENT DOCUMENTS

JP 2015-111656 A 6/2015

* cited by examiner

*Primary Examiner* — Nathaniel R Pelton
(74) *Attorney, Agent, or Firm* — Oliff PLC

(57) ABSTRACT

A secondary battery and a control section are included. An electrode of the secondary battery has a singular point at which a variation in an output voltage with respect to a capacity is singularly changed. The control section includes a detection section and a calculation setting section. The detection section changes the capacity of the secondary battery, and detects a singular point capacity which is the capacity at which the singular point appears. When the secondary battery is deteriorated, the calculation setting section calculates and sets at least one of an upper limit value and a lower limit value of the capacity by using a detection value of the singular point capacity after the deterioration so that a potential of the electrode does not deviate from a predetermined range.

10 Claims, 14 Drawing Sheets

(51) Int. Cl.
*H01M 10/48* (2006.01)
*H01M 4/02* (2006.01)

POWER SUPPLY SYSTEM

CROSS-REFERENCE TO RELATED APPLICATION

This application is based on Japanese Patent Application No. 2017-174288 filed on Sep. 11, 2017, the description of which is incorporated herein by reference.

BACKGROUND

Technical Field

The present disclosure relates to a power supply system including a secondary battery and a control section that controls charging/discharging of the secondary battery.

Related Art

A power supply system including a secondary battery such as a lithium ion secondary battery and a control section that controls charging/discharging of the secondary battery has been conventionally known.

SUMMARY

As a first aspect of the embodiment, a power supply system is provided which includes: a secondary battery; and a control section that controls charging/discharging of the secondary battery. The secondary battery includes a pair of electrodes which are a positive electrode and a negative electrode each having an active material, and is configured to output, as an output voltage, a difference between a potential of the positive electrode and a potential of the negative electrode, metal atoms being detached from/inserted into the active material. The electrode has a singular point at which a variation in the output voltage with respect to a capacity of the secondary battery is singularly changed. The control section includes a detection section that detects a singular point capacity by changing the capacity of the secondary battery and measuring a change in the output voltage, the singular point capacity being the capacity at which the singular point appears, and a calculation setting section that, when the secondary battery is deteriorated, calculates and sets at least one of an upper limit value and a lower limit value of the capacity by using a detection value of the singular point capacity after the deterioration so that the potential of the electrode does not deviate from a predetermined range.

DETAILED DESCRIPTION OF THE PREFERRED EMBODIMENTS

Figure 1:
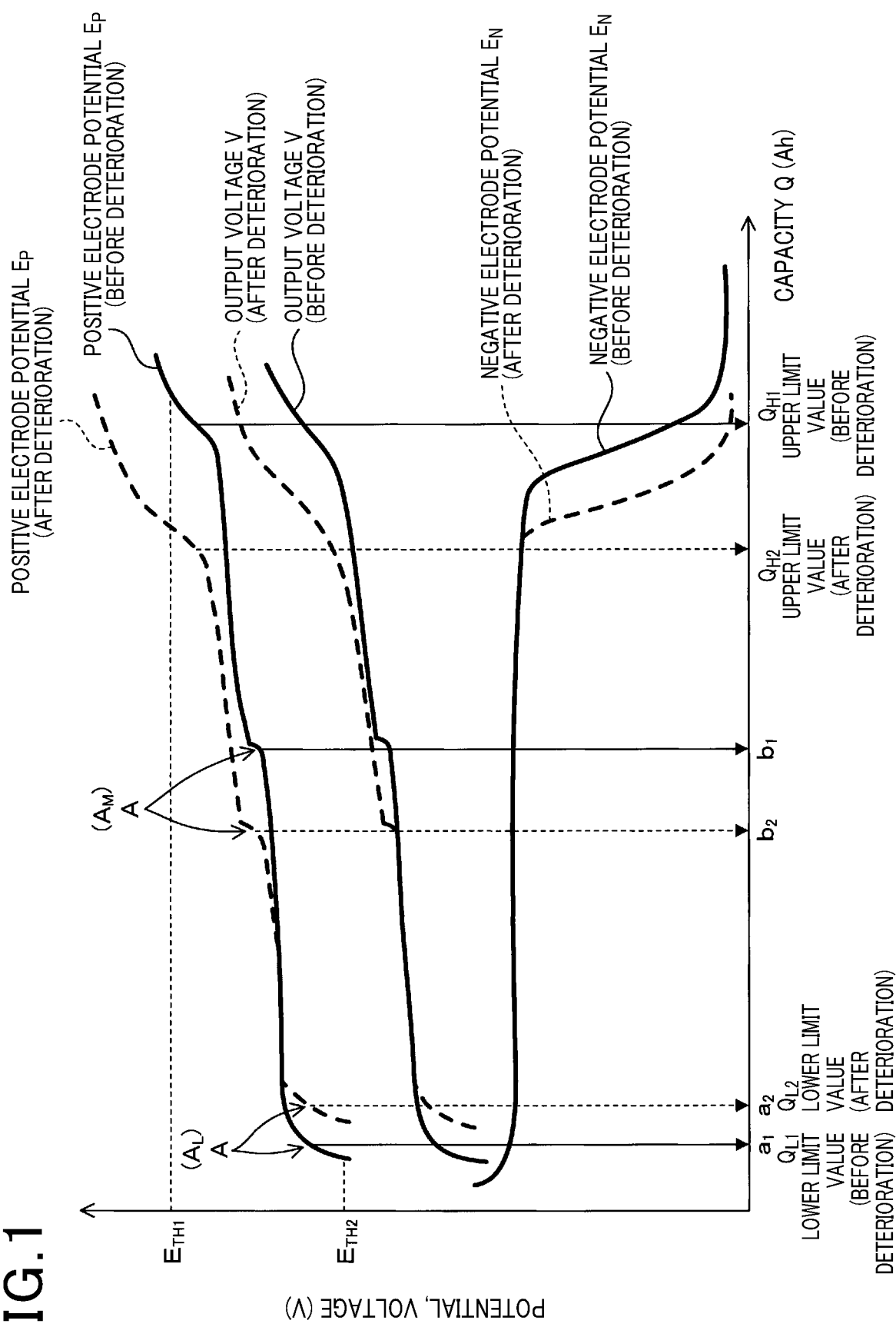
FIG. 1 is a graph showing a relationship between a positive electrode potential, an output voltage, a negative electrode potential, and a capacity before and after deterioration of a secondary battery according to a first embodiment.

A power supply system including a secondary battery such as a lithium ion secondary battery and a control section that controls charging/discharging of the secondary battery has been conventionally known (see JP 2015-111656 A). The secondary battery includes a pair of electrodes which are a positive electrode and a negative electrode. The electrodes have an active material, and when the secondary battery is charged/discharged, metal atoms such as lithium are detached from/inserted into the active material. Accordingly, potentials of the electrodes are changed (see FIG. 14). In the secondary battery, a difference between the potential of the positive electrode and the potential of the negative electrode appears as an output voltage.

An excessively high or excessively low potential of the electrode causes a problem. For example, if the potential of the electrode is excessively high, oxidative decomposition of an electrolytic solution is more likely to occur. If the potential of the electrode is excessively low, a problem of deposition of metal such as lithium or reductive decomposition of the electrolytic solution is more likely to occur. Thus, a charge/discharge capacity needs to be controlled so that the potential of the electrode does not deviate from a predetermined range.

For the control of the charge/discharge capacity, a conventional power supply system uses an output voltage. For example, when the output voltage has reached an upper limit voltage during charging, there is a possibility that the potential of the positive electrode may become excessively high or the potential of the negative electrode may become excessively low, and thus the charging may stop at that point. When the output voltage has reached a lower limit voltage during discharging, there is a possibility that the potential of the positive electrode may become excessively low or the potential of the negative electrode may become excessively high, and thus the discharging may stop at that point. Thus, a problem of a reduction in the life of the secondary battery due to the decomposition of the electrolytic solution has been prevented.

The above power supply system may be incapable of sufficiently preventing progression of deterioration of the secondary battery. Specifically, as described later, when the secondary battery is deteriorated, a relationship between the potentials of the individual electrodes and the output voltage is changed (see FIG. 14). Thus, even when the charge/discharge capacity is controlled so that the output voltage is in a predetermined range, the potential of the electrode may be excessively high or excessively low. In this case, the decomposition of the electrolytic solution or the like may progress and cause progression of the deterioration of the secondary battery. As a result, the potential of the electrode may further deviate from the predetermined range and cause further progression of the deterioration of the secondary battery.

Thus, in the case of deterioration of the secondary battery, the above power supply system has not been capable of controlling the charge/discharge capacity according to a degree of the deterioration. In the case of deterioration of the secondary battery, therefore, the potential of the electrode may have deviated from the predetermined range and consequently caused progression of the deterioration.

When a range of voltage to be used is always limited so that the potentials of the positive electrode and the negative electrode are not excessively high or excessively low, a problem occurs in which a capacity and input/output performance of the battery cannot be sufficiently exploited.

As another method, a method has been proposed in which a third reference electrode is placed in the battery and the potentials of the positive electrode and the negative electrode are measured for control. However, the method requires the placement of the reference electrode in addition to the positive electrode and the negative electrode in the battery and tends to increase a size and cost of the battery. Furthermore, the method also increases the number of signal lines for sensing the potential of the electrode and measurement processes, and thus has a problem of increased manufacturing cost of the power supply system.

The present disclosure is to provide a power supply system capable of exploiting a capacity and input/output performance and more capable of preventing progression of deterioration of a secondary battery by appropriately using a usable potential range of electrodes of the secondary battery.

First Embodiment

An embodiment of the power supply system will be described with reference to FIGS. 1 to 7. As shown in FIG. 4, a power supply system 1 of the present embodiment includes a secondary battery 2 and a control section 3 that controls charging/discharging of the secondary battery 2.

Figure 6:
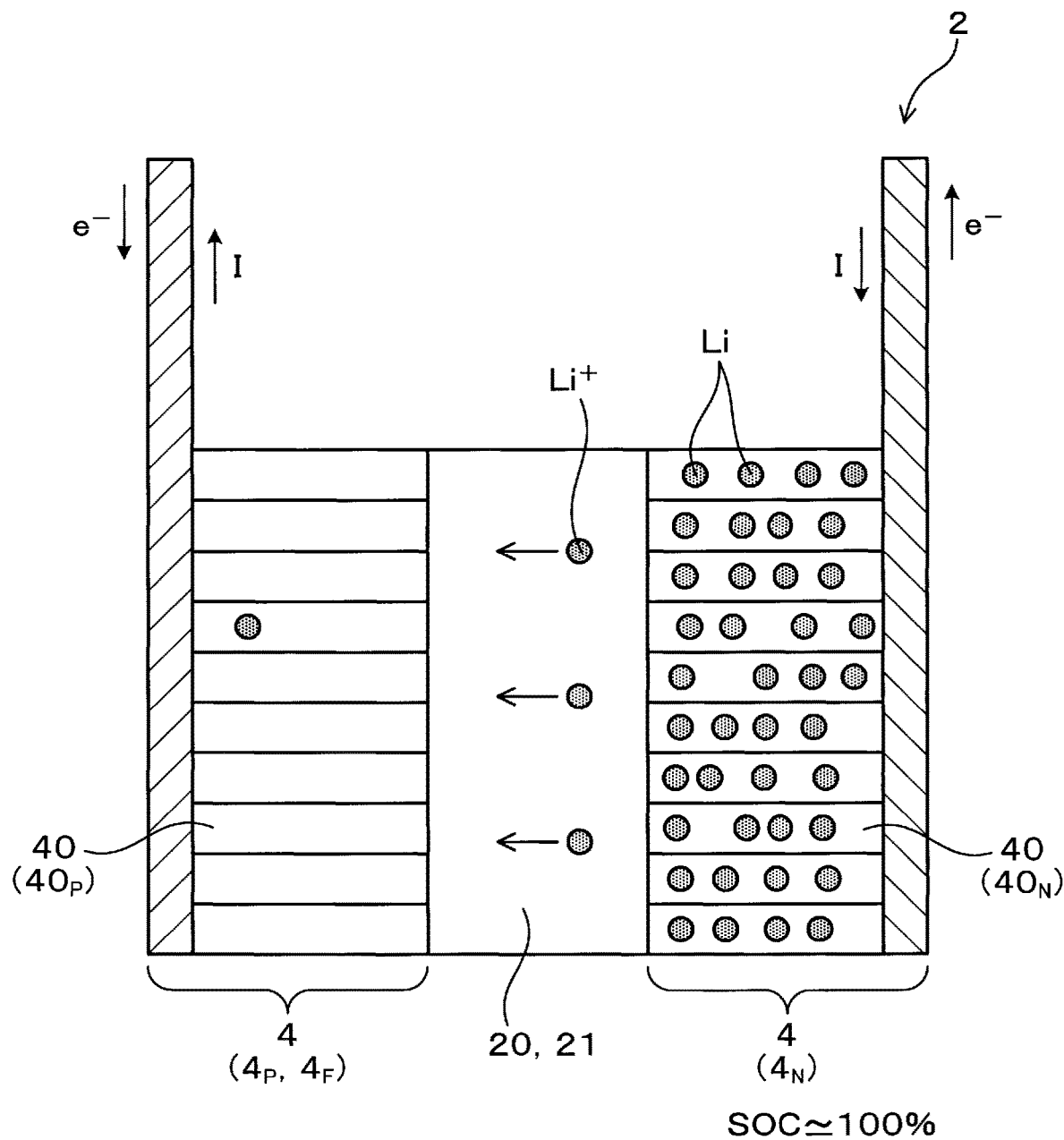
FIG. 6 is a conceptual diagram of the secondary battery in a state where a charge capacity is large according to the first embodiment.
Figure 7:
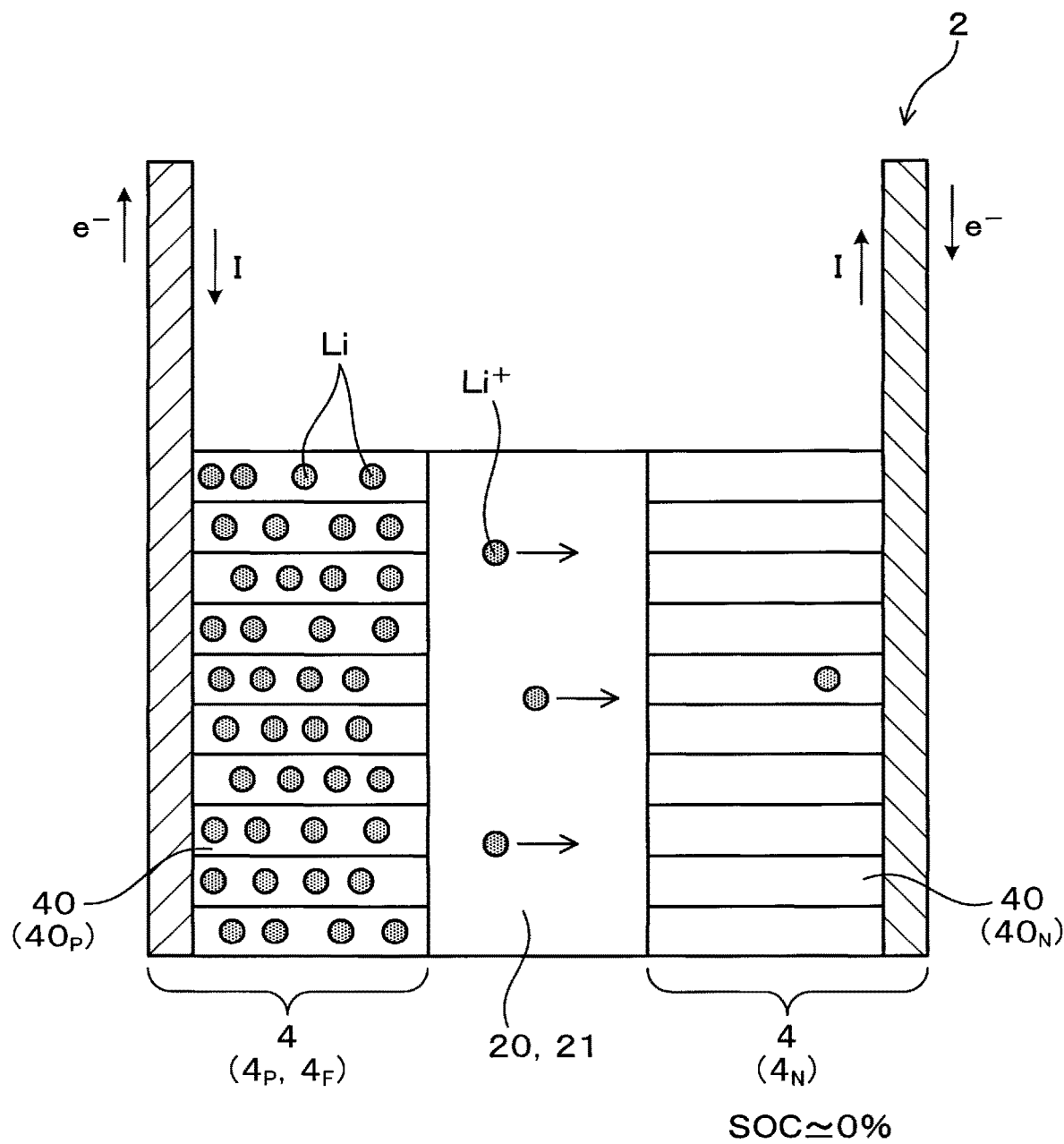
FIG. 7 is a conceptual diagram of the secondary battery in a state where the charge capacity is small according to the first embodiment.

As shown in FIGS. 6 and 7, the secondary battery 2 includes a pair of electrodes 4 which are a positive electrode $4_P$ and a negative electrode $4_N$. The electrodes $4_P$ and $4_N$ each have an active material 40. Metal atoms (lithium atoms in the present embodiment) are detached from/inserted into the active material 40. The secondary battery 2 is configured to output, as an output voltage V, a difference between a potential $E_P$ of the positive electrode $4_P$ and a potential $E_N$ of the negative electrode $4_N$.

Figure 2:
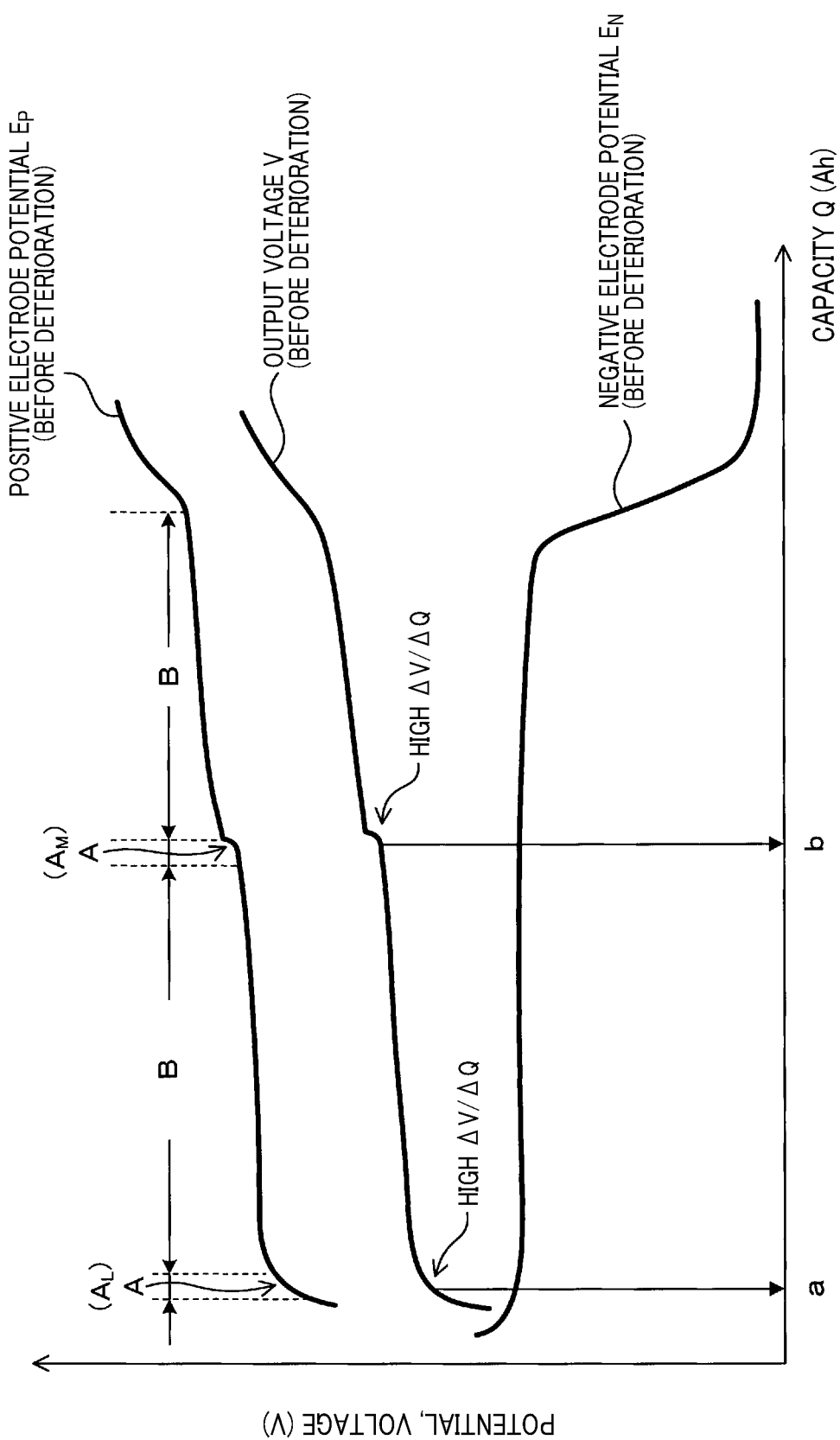
FIG. 2 is an explanatory view of a singular point and a non-singular region according to the first embodiment.

As shown in FIG. 2, the electrode 4 ($4_P$, $4_N$) has a singular point A at which a variation $\Delta V/\Delta Q$ in the output voltage V with respect to a capacity Q of the secondary battery 2 is singularly changed.

As shown in FIG. 4, the control section 3 includes a detection section 31 and a calculation setting section 32. The detection section 31 changes the capacity Q (see FIG. 1) of the secondary battery 2, and measures a change $\Delta V$ in the output voltage V. Thus, the detection section 31 detects singular point capacities a and b each of which is the capacity Q at which the singular point A (singular point A of the positive electrode $4_P$ in the present embodiment) appears.

As shown in FIG. 1, the calculation setting section 32 is configured to, when the secondary battery 2 is deteriorated, calculate and set at least one of an upper limit value $Q_H$ and a lower limit value $Q_L$ of the capacity Q by using a detection value $a_2$ of the singular point capacity a and a detection value $b_2$ of the singular point capacity b after the deterioration so that the potential $E_P$ of the electrode 4 does not deviate from a predetermined range of $E_{TH1}$ to $E_{TH2}$.

The power supply system 1 of the present embodiment is a vehicle-mounted power supply system to be mounted on a vehicle such as an electric automobile or a hybrid vehicle. As shown in FIG. 4, a charging device 10 and a load 11 are connected to the secondary battery 2. The load 11 of the present embodiment is an inverter. By using the inverter, DC power supplied from the secondary battery 2 is converted into AC power, and a three-phase AC motor (not shown) is driven. Thus, the vehicle travels. A charging switch 80 is provided between the secondary battery 2 and the charging device 10. Furthermore, a load switch 81 is provided between the secondary battery 2 and the load 11. The control section 3 controls ON/OFF operation of the switches 80 and 81. Thus, the charging/discharging of the secondary battery 2 is controlled.

The secondary battery 2 of the present embodiment is a lithium ion secondary battery. As shown in FIG. 6, the secondary battery 2 includes the pair of electrodes 4 which are the positive electrode $4_P$ and the negative electrode $4_N$, and a separator 20 and an electrolytic solution 21 provided between the pair of electrodes 4. The electrodes 4 each have the active material 40. When the secondary battery 2 is charged/discharged, lithium is detached from/inserted into the active material 40. In the present embodiment, the active material 40 of the positive electrode $4_P$ is composed of lithium manganate ($Li_xMn_2O_4$). Furthermore, the active material 40 of the negative electrode $4_N$ is composed of lithium titanate ($Li_yTi_5O_{12}$). In the lithium manganate a part of which is substituted by another element, the Li amount x of $Li_xMn_2O_4$ varies depending on a charge/discharge state, and thus a material in which x is in the range of 0 to 2 may be used. Similarly, for lithium titanate ($Li_yTi_5O_{12}$), a material in which y is in the range of 4 to 7 may be used.

In a case where a state of charge of the secondary battery 2 is high, as shown in FIG. 6, the negative electrode $4_N$ holds a larger amount of lithium than the positive electrode $4_P$. When the secondary battery 2 is discharged, lithium held in the negative electrode $4_N$ is detached and moved to the positive electrode $4_P$. At this time, electrons flow from the negative electrode $4_N$, and the positive electrode $4_P$ receives the electrons.

In a case where the state of charge of the secondary battery 2 is low, as shown in FIG. 7, the positive electrode $4_P$ holds a larger amount of lithium than the negative electrode $4_N$. When the secondary battery 2 is charged, lithium held in the positive electrode $4_P$ is detached and moved to the negative electrode $4_N$. At this time, electrons flow from the positive electrode $4_P$, and the negative electrode $4_N$ receives the electrons.

Thus, when the secondary battery 2 is charged/discharged, concentrations of lithium in the electrodes $4_P$ and $4_N$ are changed. Accordingly, as shown in FIG. 2, the potential $E_P$ of the electrode $4_P$ and the potential $E_N$ of the electrode $4_N$ are changed. Furthermore, a difference between the potential $E_P$ of the electrode $4_P$ and the potential $E_N$ of the electrode $4_N$ appears as the output voltage V. The control section 3 measures the output voltage V. As described above, the positive electrode 4P has the singular point A. At the singular point A, the variation $\Delta V/\Delta Q$ is high. By measuring the variation $\Delta V/\Delta Q$, the control section 3 detects the singular point A, and also detects the singular point capacities a and b each of which is the capacity Q at which the singular point A appears.

As described above, in the present embodiment, the positive electrode $4_P$ is composed of lithium manganate, and the negative electrode $4_N$ is composed of lithium titanate. In the secondary battery 2, the positive electrode $4_P$ is a high deterioration rate electrode $4_F$ having a higher deterioration rate than the negative electrode $4_N$ (see FIG. 1). As shown in FIG. 2, the high deterioration rate electrode $4_F$ (positive electrode 4P) has a center singular point $A_M$ sandwiched between two non-singular regions B. The non-singular region B is a region in which the variation $\Delta V/\Delta Q$ is smaller than a predetermined value. Furthermore, the high deterioration rate electrode $4_F$ (positive electrode $4_P$) has a low side singular point $A_L$ which is the singular point A that appears when the capacity Q is lower than the center singular point $A_M$. By measuring the variation $\Delta V/\Delta Q$, the control section 3 detects the capacities Q (i.e., the singular point capacities a and b) at which the low side singular point $A_L$ and the center singular point $A_M$ appear.

As shown in FIG. 1, when the secondary battery 2 is deteriorated, behavior of the positive electrode potential $E_P$ and the negative electrode potential $E_N$ is changed. This is presumably because when the charging/discharging of the secondary battery 2 is repeated, lithium is repeatedly detached from/inserted into the electrode 4, and due to a change in crystal structure of the electrode 4 and thus a change in volume of the electrode, the Li amount that can be used for the charging/discharging is reduced in the positive electrode active material. As shown in FIG. 1, when the secondary battery 2 is deteriorated, the positive electrode potential $E_P$ is more likely to have a high value even if the capacity Q is small. Thus, if the upper limit value $Q_H$ of the capacity Q remains as a value $Q_{H1}$ obtained before the deterioration, the positive electrode potential $E_P$ exceeds the upper limit potential $E_{TH1}$, and a problem such as oxidative decomposition of the electrolytic solution 21 is more likely to occur.

As shown in FIG. 1, when the secondary battery 2 is deteriorated, in some cases, the low side singular point $A_L$ is moved to the right side of FIG. 1. Thus, if the lower limit value $Q_L$ of the capacity Q remains as a value $Q_{L1}$ obtained before the deterioration, the positive electrode potential $E_P$ becomes lower than the lower limit potential $E_{TH2}$, and a problem such as reductive decomposition of the electrolytic solution 21 or progression of the deterioration due to the change in crystal structure of the positive electrode is more likely to occur. In the present embodiment, therefore, when the secondary battery 2 is deteriorated, the upper limit value $Q_H$ and the lower limit value $Q_L$ of the capacity Q are changed so that the positive electrode potential $E_P$ does not deviate from the range of $E_{TH1}$ to $E_{TH2}$.

More specifically, in the present embodiment, by using a singular point capacity $a^1$ corresponding to the low side singular point $A_L$, a singular point capacity $b_1$ corresponding to the center singular point $A_M$, and the upper limit value $Q_{H1}$ and the lower limit value $Q_{L1}$ before the secondary battery 2 is deteriorated, and a singular point capacity $a_2$ corresponding to the low side singular point $A_L$ and a singular point capacity $b_2$ corresponding to the center singular point $A_M$ after the deterioration, an upper limit value $Q_{H2}$ and a lower limit value $Q_{L2}$ of the capacity Q after the deterioration are calculated by the following equations.

$$Q_{H2}=(b_2-a_2)/(b_1-a_1)\times(Q_{H1}-b_1)+b_2 \qquad (1)$$

$$Q_{L2}=(b_2-a_2)/(b_1-a_1)\times(Q_{H1}-a_1)+a_2 \qquad (2)$$

A method of deriving the above equations will be described. As shown in FIG. 1, a graph of the positive electrode potential $E_P$ after the deterioration can be considered as a graph of the positive electrode potential $E_P$ before the deterioration that is smaller in overall size with respect to an X axis. Thus, when a represents the singular point capacity corresponding to the low side singular point $A_L$, b represents the singular point capacity corresponding to the center singular point $A_M$, and $Q_H$ represents the upper limit value of the capacity Q, the following ratio can be considered to be substantially the same before and after the secondary battery 2 is deteriorated.

$$(b-a):(Q_H-b)$$

Thus, the following equation is presumably satisfied.

$$(b_1-a_1):(Q_{H1}-b_1)=(b_2-a_2):(Q_{H2}-b_2)$$ Equation (1) can be derived from this equation.

Similarly, when $Q_L$ represents the lower limit value of the capacity Q, the following ratio can be considered to be almost the same before and after the secondary battery 2 is deteriorated.

$$(Q_L-a):(b-a)$$

Thus, the following equation is presumably satisfied.

$$(Q_{L1}-a_1):(b_1-a_1)=(Q_{L2}-a_2):(b_2-a_2)$$ Equation (2) can be derived from this equation.

Next, a method of detecting the singular point capacities a and b will be described. The control section 3 of the present embodiment charges/discharges the secondary battery 2 and measures an electric current I every very short time t, and calculates the capacity Q of the secondary battery 2 by the following equation.

$$Q=\Sigma It$$

As described above, in the present embodiment, the singular points $A_M$ and $A_L$ are formed for the positive electrode $4_P$. At the singular points $A_M$ and $A_L$, the variation $\Delta V/\Delta Q$ is steep. The control section 3 detects, as the singular point capacities a and b, the capacities Q when the variation $\Delta V/\Delta Q$ is larger than a predetermined value.

Figure 3:
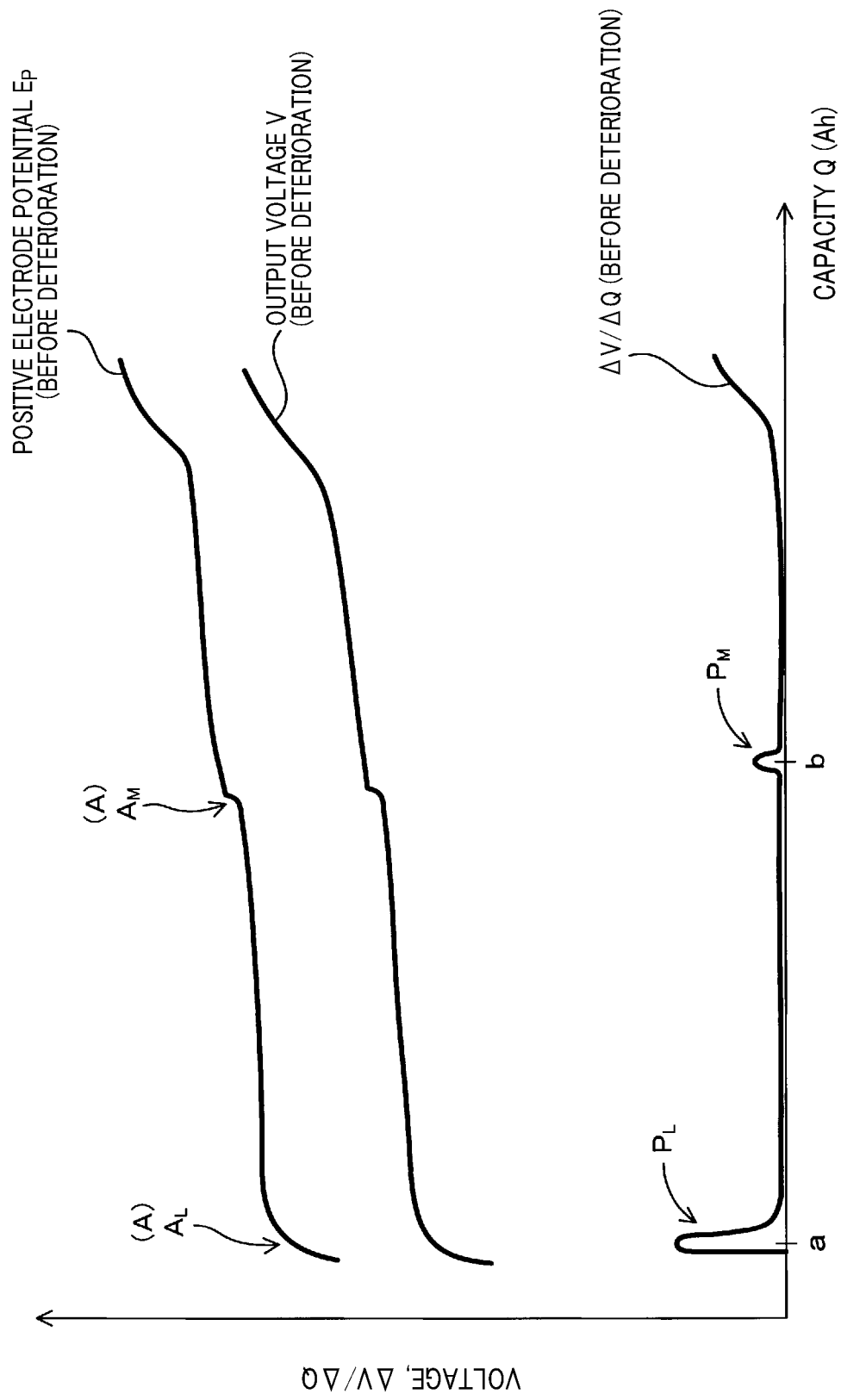
FIG. 3 is a graph showing a relationship between the positive electrode potential, the output voltage, $\Delta V/\Delta Q$, and the capacity according to the first embodiment.
Figure 4:
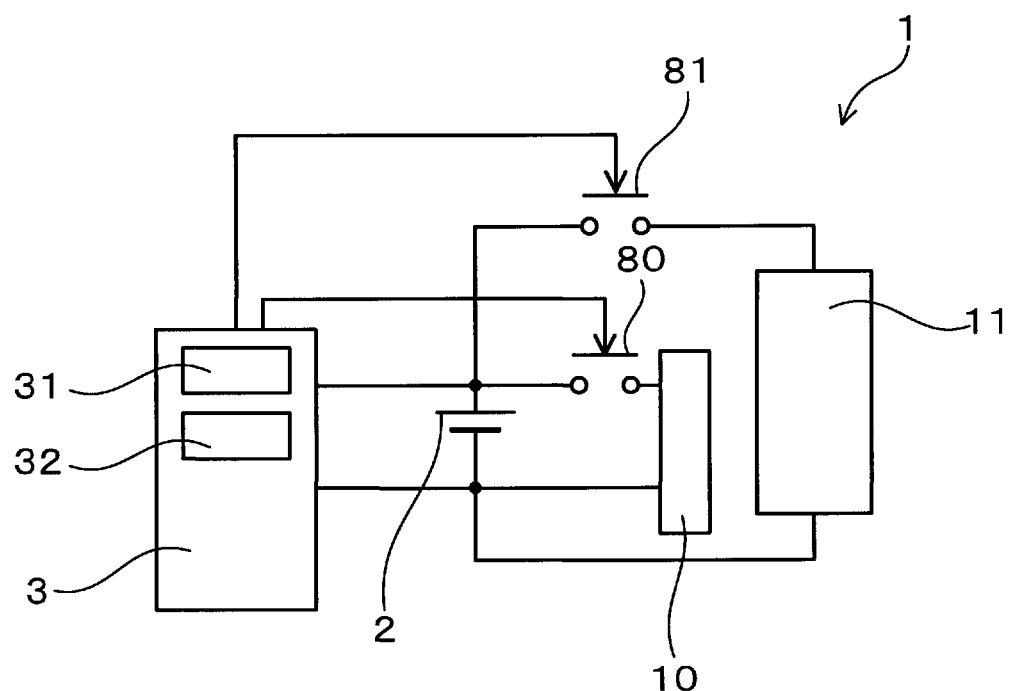
FIG. 4 is a conceptual diagram of a power supply system according to the first embodiment.

Thus, as shown in FIG. 3, the control section 3 charges/discharges the secondary battery 2, and calculates $\Delta V/\Delta Q$ by dividing a variation $\Delta V$ in the output voltage V by a variation $\Delta Q$ in the capacity Q. At positions corresponding to the two singular points $A_L$ and $A_M$, peaks $P_L$ and $P_M$ at which $\Delta V/\Delta Q$ is high appear. The control section 3 detects, as the singular point capacities a and b, the capacities Q at which the peaks $P_L$ and $P_M$ have a maximal value.

Figure 5:
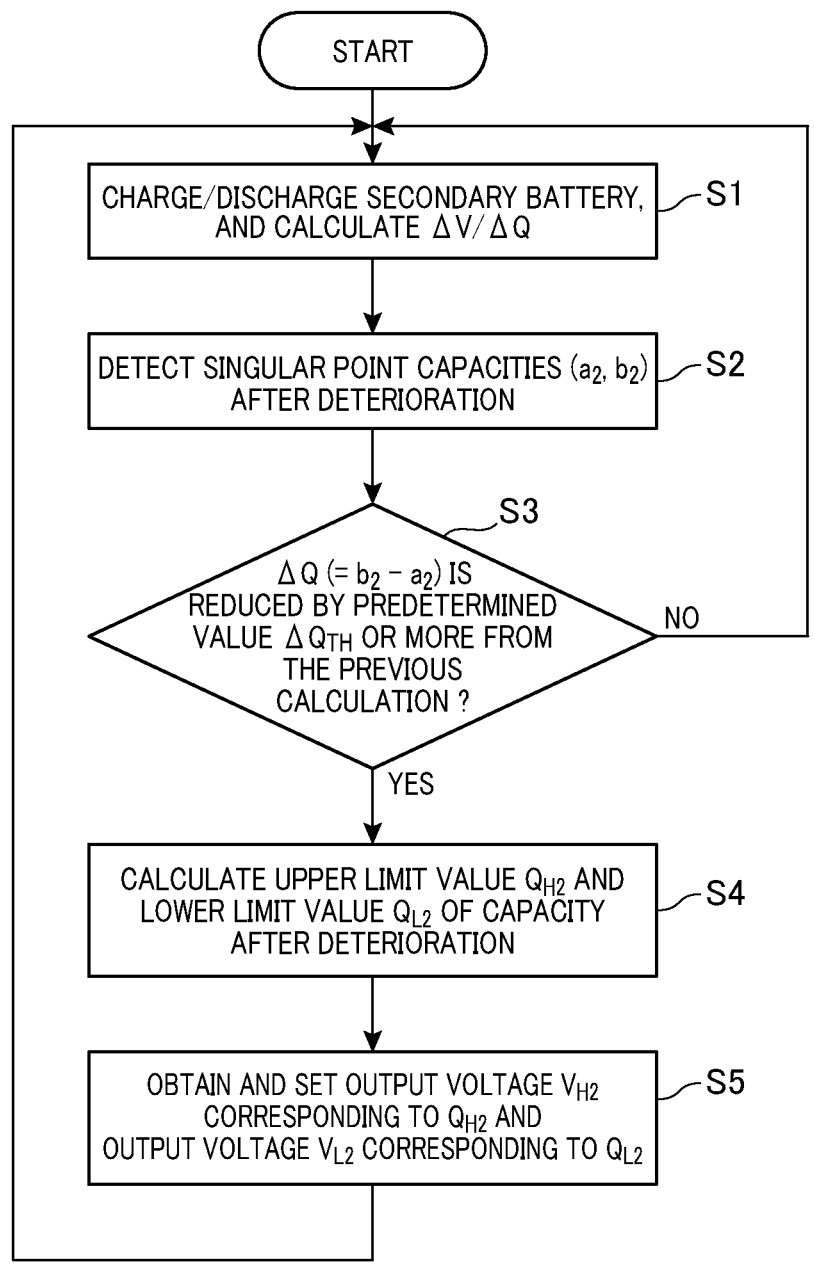
FIG. 5 a flow chart for a control section according to the first embodiment.

Next, a flow chart for the control section 3 will be described. As shown in FIG. 5, first, the control section 3 of the present embodiment performs step S1. At this step, the secondary battery 2 is charged/discharged, and $\Delta V/\Delta Q$ is calculated. Then, the control proceeds to step S2. At this step, the singular point capacities $a_2$ and $b_2$ after the deterioration are detected.

Next, the control proceeds to step S3. At this step, a difference $\Delta Q$ (=$b_2$-$a_2$) is calculated between the singular point capacity $b_2$ corresponding to the center singular point $A_M$ and the singular point capacity $a_2$ corresponding to the low side singular point $A_L$ after the deterioration. Then, it is determined whether the difference $\Delta Q$ is reduced by a predetermined value $\Delta Q_{TH}$ or more as compared with the time when the upper limit value $Q_H$ and the lower limit value $Q_L$ are previously calculated. When an affirmative determination (Yes) is made at this step, the control proceeds to step S4. When a negative determination (No) is made at this step, the control proceeds to step S1. In the present embodiment, by performing step S3, only when the deterioration of the secondary battery 2 has progressed to some extent from the previous calculation of the upper limit value $Q_H$ and the lower limit value $Q_L$, a process at step S4 and subsequent steps (a process of calculating the upper limit value $Q_H$ and the lower limit value $Q_L$ again) is performed. Specifically, when the deterioration of the secondary battery 2 progresses, the two singular point capacities b2 and a2 approach each other (see FIG. 1), and thus the difference $\Delta Q$ between the singular point capacities $b_2$ and $a_2$ is reduced. Only when the difference $\Delta Q$ is reduced by the predetermined value $\Delta Q_{TH}$ or more, i.e., when the deterioration has progressed to some extent, the process at step S4 and subsequent steps is performed.

At step S4, the upper limit value $Q_{H2}$ and the lower limit value $Q_{L2}$ of the capacity Q after the deterioration are calculated by equations (1) and (2). Then, the control proceeds to step S5. At this step, an output voltage $V_{H2}$ corresponding to the calculated upper limit value $Q_{H2}$ and an output voltage $V_{L2}$ corresponding to the calculated lower limit value $Q_{L2}$ are obtained. These values can be obtained, for example, by causing the capacity Q of the secondary battery 2 to have the upper limit value $Q_{H2}$ or the lower limit value $Q_{L2}$ and measuring the output voltage V at this time. Until the next time the upper limit value $Q_{H2}$ and the lower limit value $Q_{L2}$ are changed, the control section 3 controls the charging/discharging of the secondary battery 2 so that the output voltage V is in the range of values $V_{H2}$ to $V_{L2}$. Thus, the control section 3 controls the charging/discharging so that the capacity Q of the secondary battery 2 is between the upper limit value $Q_{H2}$ and the lower limit value $Q_{L2}$.

Next, effects of the present embodiment will be described. As shown in FIG. 4, the control section 3 of the present embodiment includes the detection section 31 and the calculation setting section 32.

Thus, progression of the deterioration of the secondary battery 2 can be effectively prevented. Specifically, the electrode 4 of the present embodiment has the singular point A. The control section 3 detects the singular point capacities a and b each of which is the capacity Q at which the singular point A appears. When the electrode 4 is deteriorated, the values of the singular point capacities a and b are changed (see FIG. 1). Accordingly, the singular point capacities a and b can be used as indicators of the degree of the deterioration of the electrode 4. By using the singular point capacities a and b, therefore, the upper limit value $Q_H$ and the lower limit value $Q_L$ of the capacity Q can be set to optimum values according to the degree of the deterioration of the electrode 4. This makes it possible to prevent a potential E of the deteriorated electrode 4 from deviating from the predetermined range of $E_{TH1}$ to $E_{TH2}$ and prevent progression of the deterioration of the secondary battery 2.

Figure 14:
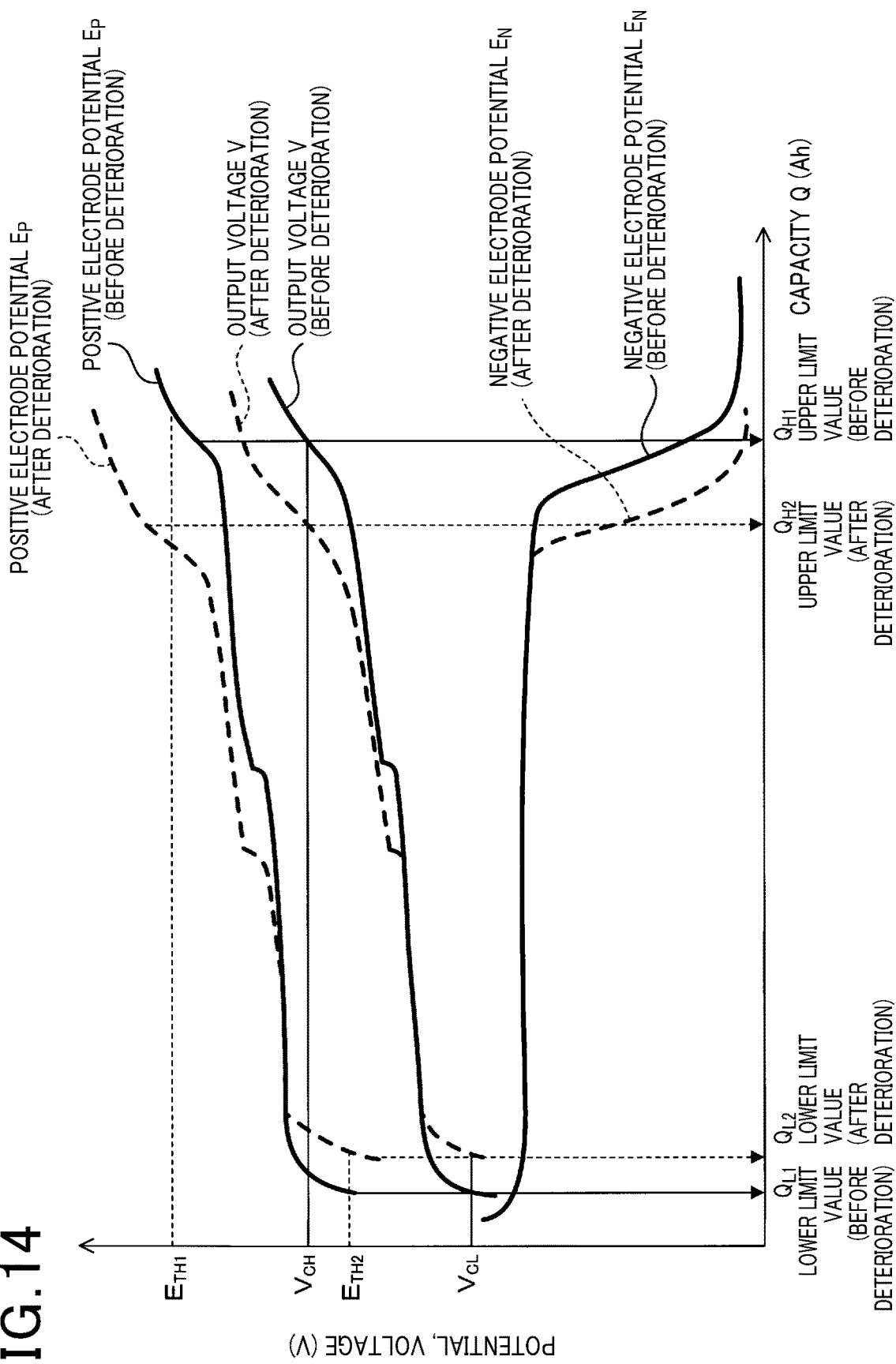
FIG. 14 is a graph showing a relationship between a positive electrode potential, an output voltage, a negative electrode potential, and a capacity before and after deterioration of a secondary battery according to a comparative embodiment.

As shown in FIG. 14, if the upper limit value $Q_H$ of the capacity Q is set to a value of the capacity Q at which the output voltage V has reached a predetermined value $V_{CH}$, when the secondary battery 2 is deteriorated, the positive electrode potential $E_P$ may exceed the upper limit potential $E_{TH1}$. Thus, when the positive electrode potential $E_P$ and the negative electrode potential $E_N$ at the upper limit value $Q_H$ are compared before and after the deterioration, the positive electrode potential $E_P$ and the negative electrode potential $E_N$ after the deterioration have high values overall. Furthermore, differences ($E_P$-$E_N$) between the positive electrode potential $E_P$ and the negative electrode potential $E_N$ at the upper limit value $Q_H$ before and after the deterioration are equal to each other. Accordingly, the output voltage V has the same value $V_CH$ before and after the deterioration. However, the two electrode potentials $E_P$ and $E_N$ are both increased, and thus the positive electrode potential $E_P$ may exceed the upper limit value $E_{TH1}$. This may cause progression of the oxidative decomposition of the electrolytic solution 21. As a result, the positive electrode potential $E_P$ may further deviate from the upper limit value $E_{TH1}$ and cause further progression of the decomposition of the electrolytic solution 21.

Similarly, if the lower limit value $Q_L$ of the capacity Q is set to a value of the capacity Q at which the output voltage V has reached a predetermined value $V_{CL}$, when the secondary battery 2 is deteriorated, the positive electrode potential $E_P$ may become lower than the lower limit value $E_{TH2}$. This may progress the reductive decomposition of the electrolytic solution 21 or the change in crystal structure of the positive electrode active material. As a result, the positive electrode potential $E_P$ may further deviate from the lower limit value $E_{TH2}$ and cause further progression of the decomposition of the electrolytic solution 21.

Thus, if the charging/discharging of the secondary battery 2 is controlled by using the output voltage V as described above, when the secondary battery 2 is deteriorated, the upper limit value $Q_H$ and the lower limit value $Q_L$ of the capacity Q cannot be changed to optimum values according to the degree of the deterioration. Therefore, the potential E of the electrode 4 may further deviate from the predetermined range of $E_{TH1}$ to $E_{TH2}$ and cause progression of the deterioration of the secondary battery 2.

On the other hand, by using the singular point capacities $a_2$ and $b_2$ as in the present embodiment, the upper limit value $Q_{H2}$ and the lower limit value $Q_{L2}$ can be set to optimum values according to the degree of the deterioration of the secondary battery 2. This makes it possible to prevent a problem in which the positive electrode potential $E_P$ deviates from the range of $E_{TH1}$ to $E_{TH2}$. Therefore, progression of the deterioration of the secondary battery 2 can be prevented.

Furthermore, the control section 3 of the present embodiment is configured to determine, as the singular point A, a state where the variation $\Delta V/\Delta Q$ in the output voltage V with respect to the capacity Q of the secondary battery 2 is higher than the predetermined value.

In this case, the singular point A can be easily detected. This makes it possible to easily detect the capacity Q (i.e., the singular point capacities a and b) at which the singular point A appears.

Furthermore, in the present embodiment, the center singular point $A_M$ which is the singular point A sandwiched between the two non-singular regions B is formed for the high deterioration rate electrode $4_F$ (the positive electrode $4_P$ in the present embodiment) which is the electrode 4 having a higher deterioration rate between the pair of electrodes $4_P$ and $4_N$.

Since the center singular point $A_M$ is present between the two non-singular regions B, the center singular point $A_M$ is easily detected. Therefore, by forming the center singular point $A_M$ for the high deterioration rate electrode $4_F$ having a high deterioration rate, deterioration of the high deterioration rate electrode $4_F$ is easily detected, and thus the upper limit value $Q_H$ and the lower limit value $Q_L$ are easily set to the optimum values.

Furthermore, as shown in FIG. 1, in the present embodiment, no center singular point $A_M$ is formed for the electrode 4 (the negative electrode $4_N$ in the present embodiment) having a lower deterioration rate. Specifically, in the negative electrode $4_N$, $\Delta V/\Delta Q$ is small except in regions close to the upper limit value $Q_H$ and the lower limit value $Q_L$.

Thus, the center singular point $A_M$ of the positive electrode $4_P$ is easily detected.

Furthermore, in the present embodiment, the upper limit value $Q_{H2}$ and the lower limit value $Q_{L2}$ of the capacity Q after the deterioration are calculated by equations (1) and (2).

Thus, the upper limit value $Q_{H2}$ and the lower limit value $Q_{L2}$ after the deterioration can be accurately calculated.

Furthermore, as shown at step S3 in FIG. 5, the control section 3 of the present embodiment calculates the difference $\Delta Q$ ($=b_2-a_2$) between the two singular point capacities $a_2$ and $b_2$. The control section 3 is configured to calculate the upper limit value $Q_H$ and the lower limit value $Q_L$ again when the difference $\Delta Q$ is reduced by the predetermined value $\Delta Q_{TH}$ or more as compared with the time when the upper limit value $Q_H$ and the lower limit value $Q_L$ are previously calculated.

Thus, the control section 3 needs to calculate the upper limit value $Q_H$ and the lower limit value $Q_L$ only when the difference $\Delta Q$ is reduced by the value $\Delta Q_{TH}$ or more, i.e., when the deterioration of the secondary battery 2 has progressed to some extent. Therefore, the upper limit value $Q_H$ and the lower limit value $Q_L$ do not need to be frequently calculated, and thus the load on the control section 3 can be reduced.

Furthermore, as shown at step S5 in FIG. 5, the control section 3 of the present embodiment is configured to control the charging/discharging of the secondary battery 2 so that the output voltage V is between the first voltage $V_{H2}$ which is a value corresponding to the upper limit value $Q_{H2}$ and the second voltage $V_{L2}$ which is a value corresponding to the lower limit value $Q_{L2}$ after the upper limit value $Q_H$ and the lower limit value $Q_L$ are calculated.

It is relatively difficult to detect whether the capacity Q of the secondary battery 2 has reached the upper limit value $Q_H$ or the lower limit value $Q_L$, but it is easy to measure the output voltage V. Therefore, by using the output voltage V, the capacity Q of the secondary battery 2 can be easily controlled.

Furthermore, the secondary battery 2 of the present embodiment is a lithium ion secondary battery. The positive electrode $4_P$ of the secondary battery 2 is regarded as the high deterioration rate electrode $4_F$ having the center singular point $A_M$.

In the lithium ion secondary battery, if the potential $E_P$ of the positive electrode $4_P$ is excessively high or excessively low, decomposition of the electrolytic solution 21 is more likely to occur. Therefore, a large effect is achieved by forming the center singular point $A_M$ for the positive electrode $4_P$ and performing the control using the center singular point $A_M$ so that the positive electrode potential $E_P$ is in the predetermined range of $E_{TH1}$ to $E_{TH2}$.

Furthermore, in the present embodiment, the positive electrode $4_P$ is composed of $LiMn_2O_4$, and the negative electrode $4_N$ is composed of $Li_4Ti_5O_{12}$. When lithium is inserted into $LiMn_2O_4$, a change in crystal structure occurs, and thus the center singular point $A_M$ is easily formed. Even when lithium is inserted into $Li_4Ti_5O_{12}$, no change in crystal structure occurs. Thus, no center singular point $A_M$ is formed for the negative electrode $4_N$. This makes it easier to detect a high variation (i.e., variation $\Delta V/\Delta Q$) in the output voltage V that appears at a position corresponding to the center singular point $A_M$ of the positive electrode $4_P$ and thus makes it possible to easily detect the singular point capacity b.

As has been described, the present embodiment can provide a power supply system more capable of preventing progression of deterioration of a secondary battery.

In the present embodiment, when the secondary battery 2 is deteriorated, both the upper limit value $Q_{H2}$ and the lower limit value $Q_{L2}$ are changed, but the present disclosure is not limited to this, and only one of the upper limit value $Q_{H2}$ and the lower limit value $Q_{L2}$ may be changed.

In the present embodiment, the lithium ion secondary battery is used as the secondary battery 2, but the present disclosure is not limited to this. Another type of secondary battery 2 such as a sodium ion secondary battery may be used.

Second Embodiment

The present embodiment is an example in which the configuration of the secondary battery 2 is modified. In the present embodiment, the positive electrode $4_P$ is formed by mixing a plurality of electrode materials. More specifically, the positive electrode $4_P$ is formed by mixing $LiMn_2O_4$ with $LiCoO_2$. As in the first embodiment, the negative electrode $4_N$ is composed of $Li_4Ti_5O_{12}$.

Figure 8:
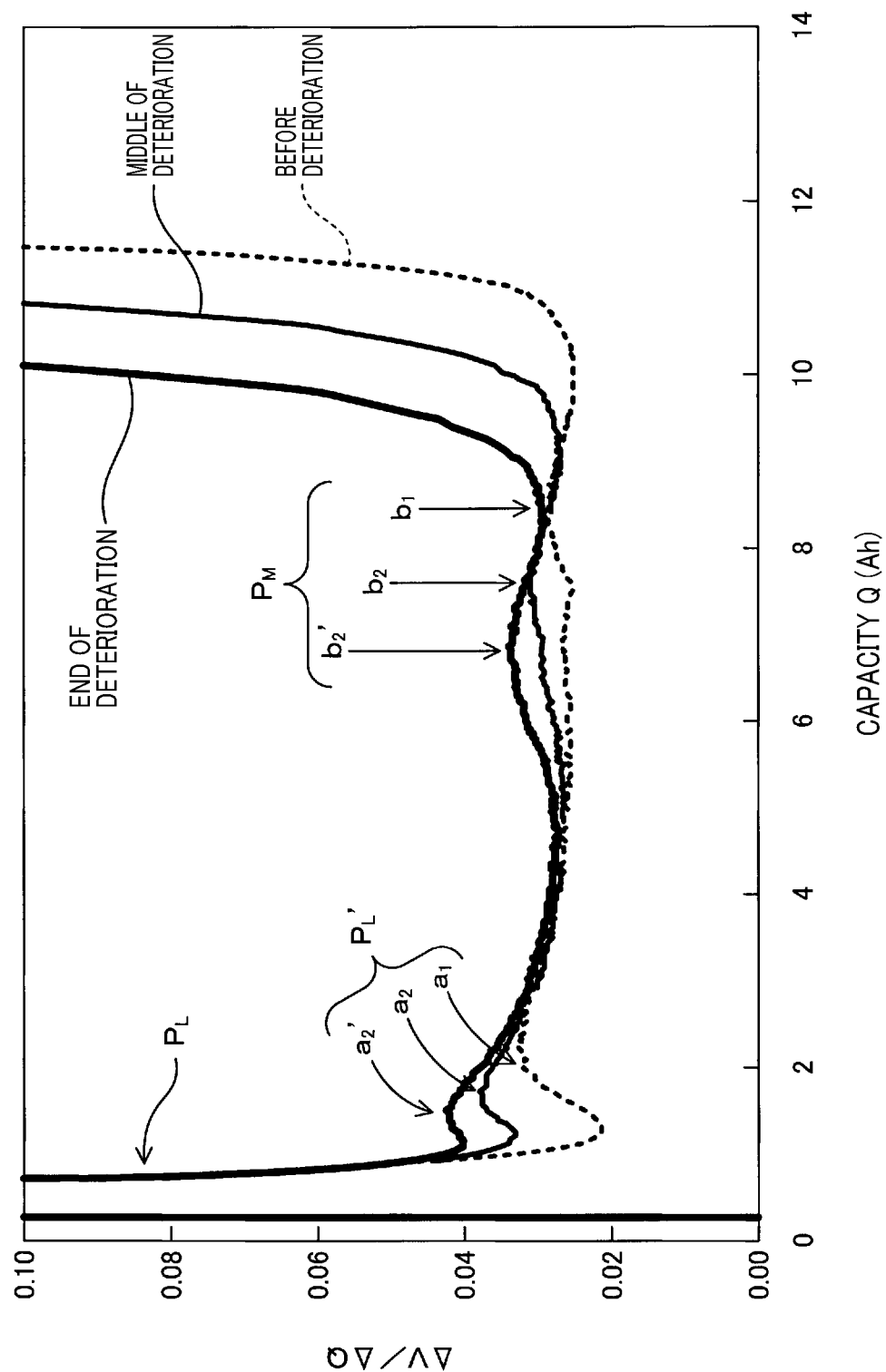
FIG. 8 is a graph showing a relationship between $\Delta V/\Delta Q$ and the capacity before and after the deterioration according to a second embodiment.

FIG. 8 shows a relationship between the variation $\Delta V/\Delta Q$ and the capacity Q when the above secondary battery 2 is used. As shown in FIG. 8, two peaks $P_L$ and $P_L'$ appear in a region in which the capacity Q is low. The second peak PC is generated by the mixing of $LiCoO_2$ into the positive electrode $4_P$. In the present embodiment, the second peak PL' is used to detect the singular point capacity a.

Effects of the present embodiment will be described. In the present embodiment, the high deterioration rate electrode $4_F$ (positive electrode $4_P$) is formed by mixing the plurality of electrode materials. Thus, a plurality of singular points A can be easily formed. Accordingly, for example as shown in FIG. 8, a plurality of peaks of $\Delta V/\Delta Q$ can be formed in the region in which the capacity Q is low. Therefore, the singular point capacity a can be detected by using a peak (second peak PL' in the present embodiment) at which deterioration of the electrode 4 is easily detected.

In addition, the present embodiment has the same configuration and effects as the first embodiment.

Third Embodiment

The present embodiment is an example in which the configuration of the secondary battery 2 is modified. In the present embodiment, the positive electrode $4_P$ is composed of an electrode material containing $Li_xMn_{2-z}Me_zO_4$ (z=0 to 0.5, Me is Li or transition metal, x=0 to 2) obtained by substituting a part of lithium manganate by another element.

Furthermore, the negative electrode $4_N$ is composed of an electrode material containing lithium titanate $Li_yTi_5O_{12}$.

In the lithium manganate a part of which is substituted by another element, the Li amount x of $Li_xMn_{2-z}Me_zO_4$ varies depending on a charge/discharge state, and thus a material in which x is in the range of 0 to 2 may be used. Similarly, for lithium titanate ($Li_yTi_5O_{12}$), a material in which y is in the range of 4 to 7 may be used.

By using $Li_xMn_{2-z}Me_zO_4$ obtained by substituting a part of lithium manganate by another element, the positive electrode $4_P$ having a long life can be formed. Instead of $Li_yTi_5O_{12}$, the negative electrode $4_N$ may be composed of $TiO_2$ (B) or $H_2Ti_{22}O_{25}$. These negative electrode materials have a larger capacity per weight than $Li_yTi_5O_{12}$, and thus a flat potential gradient is easily obtained.

In addition, the present embodiment has the same configuration and effects as those of the first embodiment.

Fourth Embodiment

Figure 9:
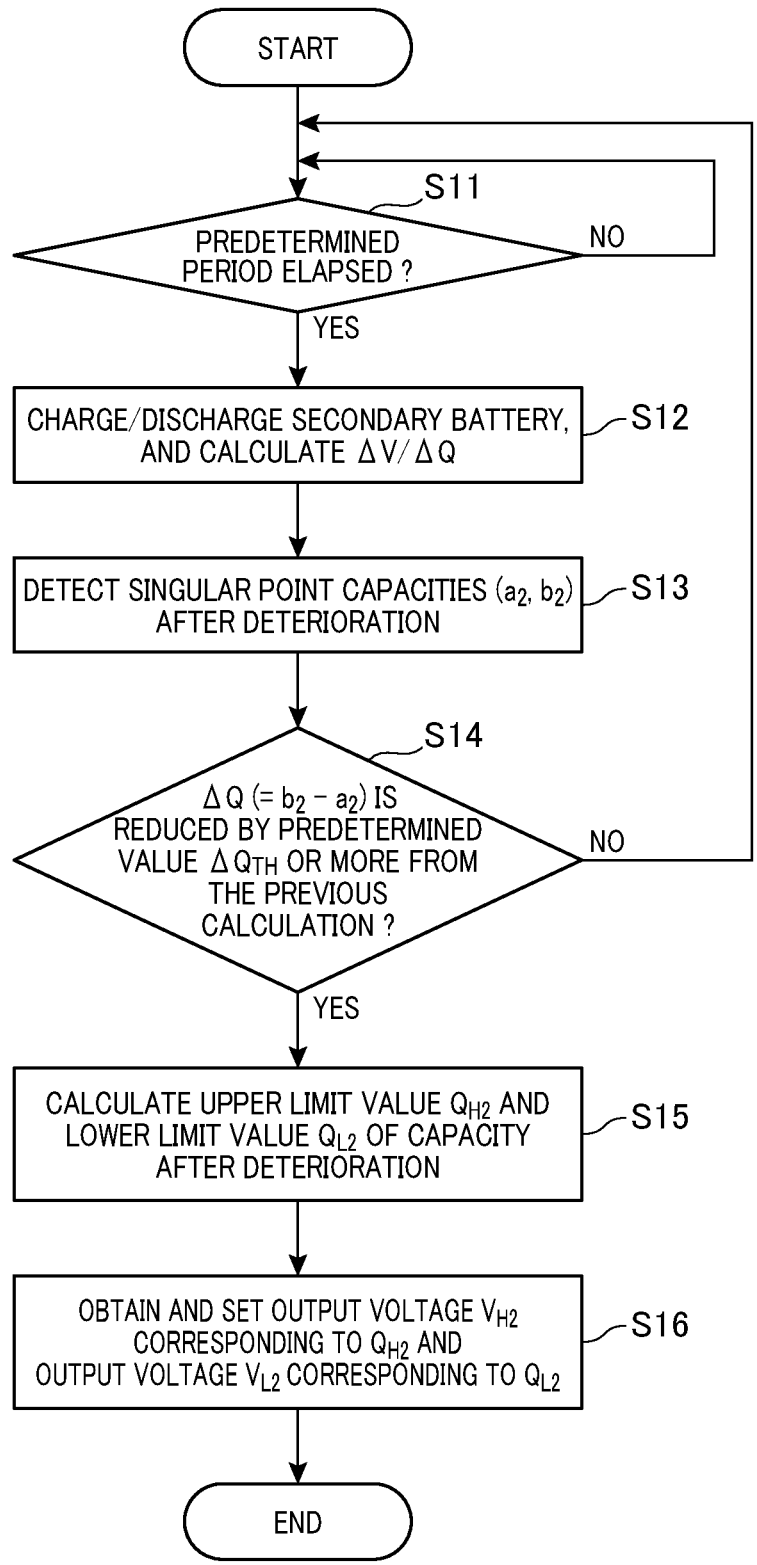
FIG. 9 is a flow chart for the control section according to a fourth embodiment.

The present embodiment is an example in which the flow chart for the control section 3 is modified. As shown in FIG. 9, first, the control section 3 of the present embodiment performs step S11. At this step, it is determined whether a predetermined period (e.g., a single day) has elapsed since the previous change of the upper limit value $Q_H$ and the lower limit value $Q_L$. When an affirmative determination (Yes) is made at this step, the control proceeds to step S12. At step S12, the secondary battery 2 is charged/discharged, and ΔV/ΔQ is calculated. Then, the control proceeds to step S13, and the singular point capacities a2 and b2 after the deterioration are detected.

Next, the control proceeds to step S14. At this step, a difference ΔQ (=b2−a2) between the two singular point capacities a2 and b2 is calculated, and it is determined whether the difference ΔQ is reduced by the predetermined value $ΔQ_{TH}$ or more from the previous calculation of the upper limit value $Q_{H2}$ and the lower limit value $Q_{L2}$. When an affirmative determination (Yes) is made at this step, the control proceeds to step S15, and when a negative determination (No) is made at this step, the control returns to step S11.

At step S15, the upper limit value $Q_{H2}$ and the lower limit value $Q_{L2}$ of the capacity Q after the deterioration are calculated again. Then, the control proceeds to step S16, and an output voltage $V_{H2}$ corresponding to the upper limit value $Q_{H2}$ and an output voltage $V_{L2}$ corresponding to the lower limit value $Q_{L2}$ are obtained.

Effects of the present embodiment will be described. In the present embodiment, it is determined whether the predetermined period (period in which resetting of the upper limit value $Q_{H2}$ and the lower limit value $Q_{L2}$ is estimated to be required) has elapsed since the previous calculation of the upper limit value $Q_{H2}$ and the lower limit value $Q_{L2}$ (step S11). Then, when it is determined that the period has elapsed (Yes), the singular point capacities $a_2$ and $b_2$ after the deterioration are detected.

Therefore, the singular point capacities $a_2$ and $b_2$ do not need to be frequently detected, and thus the load on the control section 3 can be reduced.

In addition, the present embodiment has the same configuration and effects as those of the first embodiment.

Fifth Embodiment

Figure 10:
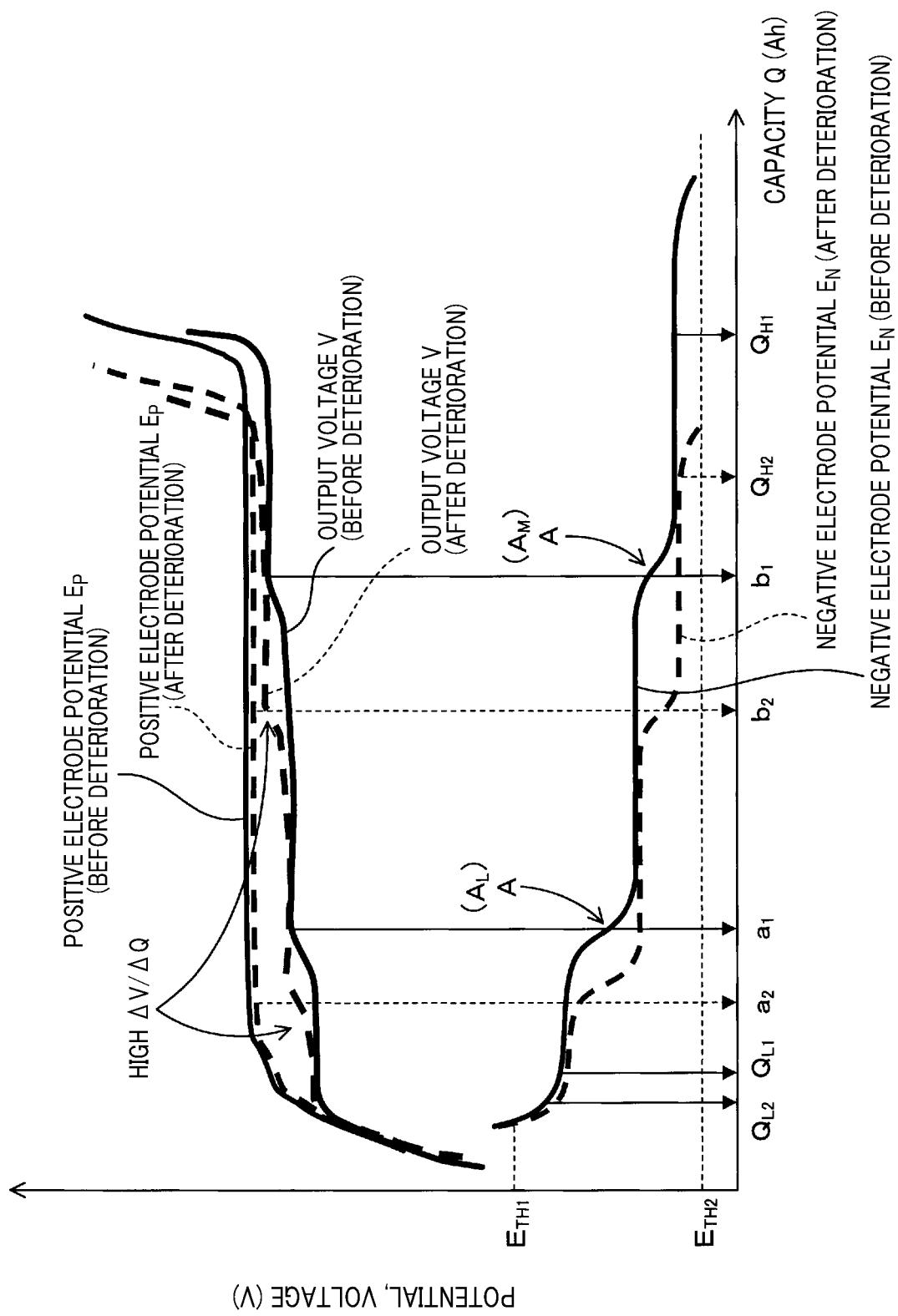
FIG. 10 is a graph showing a relationship between the positive electrode potential, the output voltage, the negative electrode potential, and the capacity before and after the deterioration of the secondary battery according to a fifth embodiment.

The present embodiment is an example in which the structure of the secondary battery 2 is modified. As shown in FIG. 10, in the present embodiment, the negative electrode $4_N$ is deteriorated faster than the positive electrode $4_P$. Thus, the negative electrode $4_N$ is regarded as the high deterioration rate electrode $4_F$. Furthermore, the center singular point $A_M$ and the low side singular point $A_L$ are formed for the negative electrode $4_N$. At the singular points $A_M$ and $A_L$, the variation ΔV/ΔQ is high. By measuring the variation ΔV/ΔQ, the control section 3 detects the singular point capacities a and b at which the singular points $A_M$ and $A_L$ appear. Furthermore, the control section 3 calculates the upper limit value $Q_{H2}$ and the lower limit value $Q_{L2}$ after the deterioration by equations (1) and (2).

In the present embodiment, the negative electrode $4_N$ is formed of graphite. Furthermore, the positive electrode $4_P$ is formed of $LiFePO_4$. Also when the negative electrode $4_N$ is composed of a material in which graphite is coated with amorphous carbon or a material in which amorphous carbon is mixed with graphite, the negative electrode $4_N$ exhibits the same behavior and can be controlled.

Effects of the present embodiment will be described. In the present embodiment, the negative electrode $4_N$ is regarded as the high deterioration rate electrode $4_F$. Furthermore, the center singular point $A_M$ and the low side singular point $A_L$ are formed for the high deterioration rate electrode $4_F$ (negative electrode $4_N$).

If the potential (i.e., the negative electrode potential $E_N$) of the negative electrode $4_N$ is excessively low, a problem such as deposition of lithium, reductive decomposition of the electrolytic solution 21, or decomposition of a carbon surface coating (SEI) once formed is more likely to occur. If the negative electrode potential $E_N$ is excessively high, oxidative decomposition of the electrolytic solution 21 may occur. Therefore, a large effect is achieved by forming the singular points $A_M$ and $A_L$ for the negative electrode $4_N$ and setting the upper limit value $Q_{H2}$ and the lower limit value $Q_{L2}$ using the singular points $A_M$ and $A_L$ so that the negative electrode potential $E_N$ does not deviate from the predetermined range of $E_{TH1}$ to $E_{TH2}$.

Furthermore, in the present embodiment, the negative electrode $4_N$ is composed of graphite. When lithium is inserted into graphite, a change in crystal structure occurs, and a region in which a potential gradient is high appears. Therefore, the singular points $A_M$ and $A_L$ are easily formed.

Furthermore, in the present embodiment, the positive electrode $4_P$ is composed of $LiFePO_4$. When lithium is inserted into $LiFePO_4$, no change in crystal structure occurs. Thus, an overall gradient of the positive electrode potential $E_P$ can be flat. This makes it easier to detect the singular points $A_M$ and $A_L$ of the negative electrode $4_N$ and thus makes it possible to easily detect the singular point capacities a and b.

In addition, the present embodiment has the same configuration and effects as those of the first embodiment.

Sixth Embodiment

Figure 13:
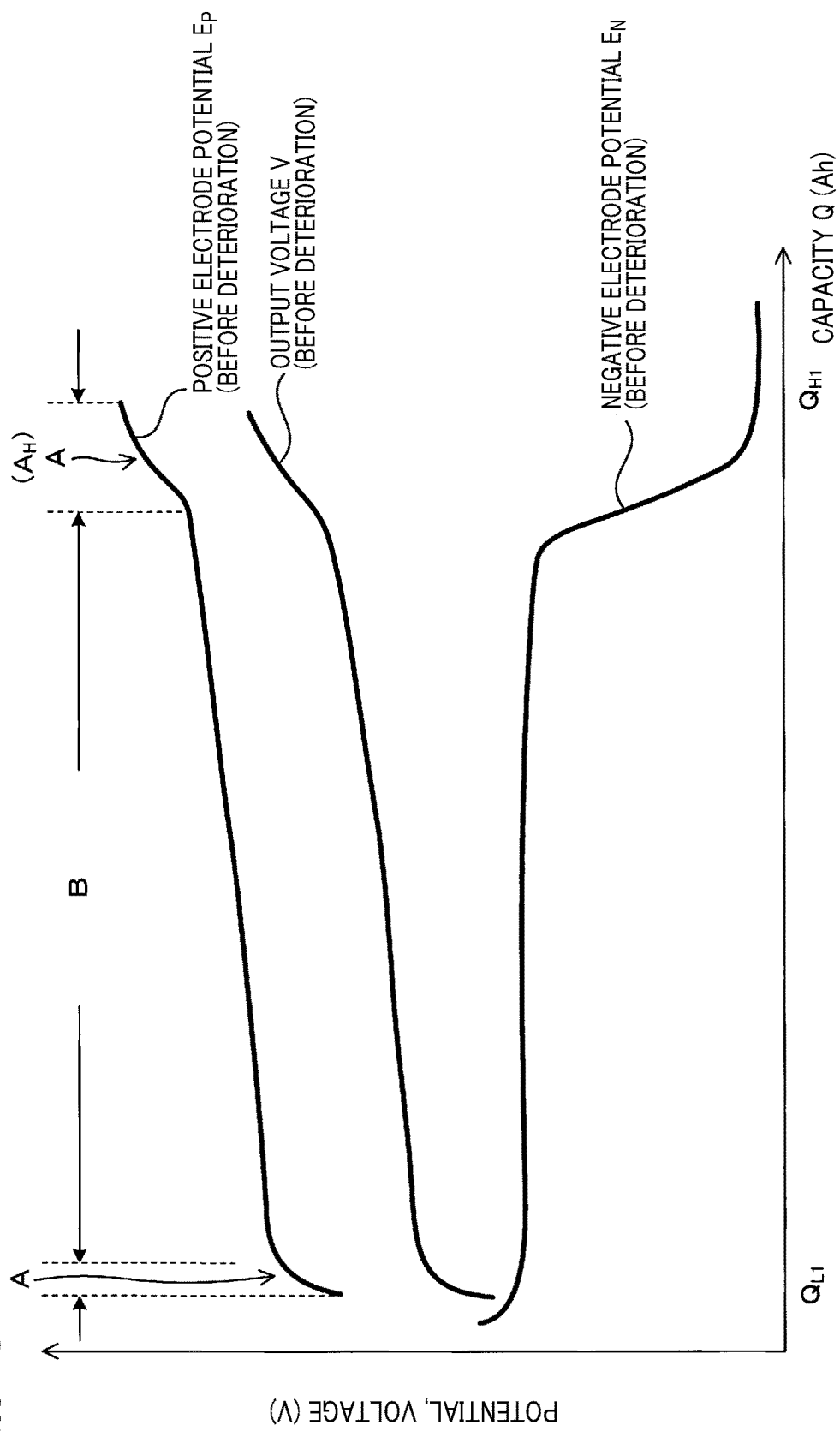
FIG. 13 is an explanatory view of a singular point and a non-singular region according to the sixth embodiment.

The present embodiment is an example in which the method of calculating the upper limit value $Q_{H2}$ and the lower limit value $Q_{L2}$ of the capacity Q after the deterioration is modified. As shown in FIG. 13, the positive electrode $4_P$ and the negative electrode $4_N$ of the present embodiment have the singular point A in regions close to the upper limit value $Q_H$ and the lower limit value $Q_L$. A region between the two singular points A is the non-singular region B in which a potential gradient is smaller than a predetermined value. In the present embodiment, by using a singular point $A_H$ of the positive electrode $4_P$ formed in the region close to the upper limit value $Q_H$, the upper limit value $Q_{H2}$ and the lower limit value $Q_{L2}$ after the deterioration are calculated.

Figure 11:
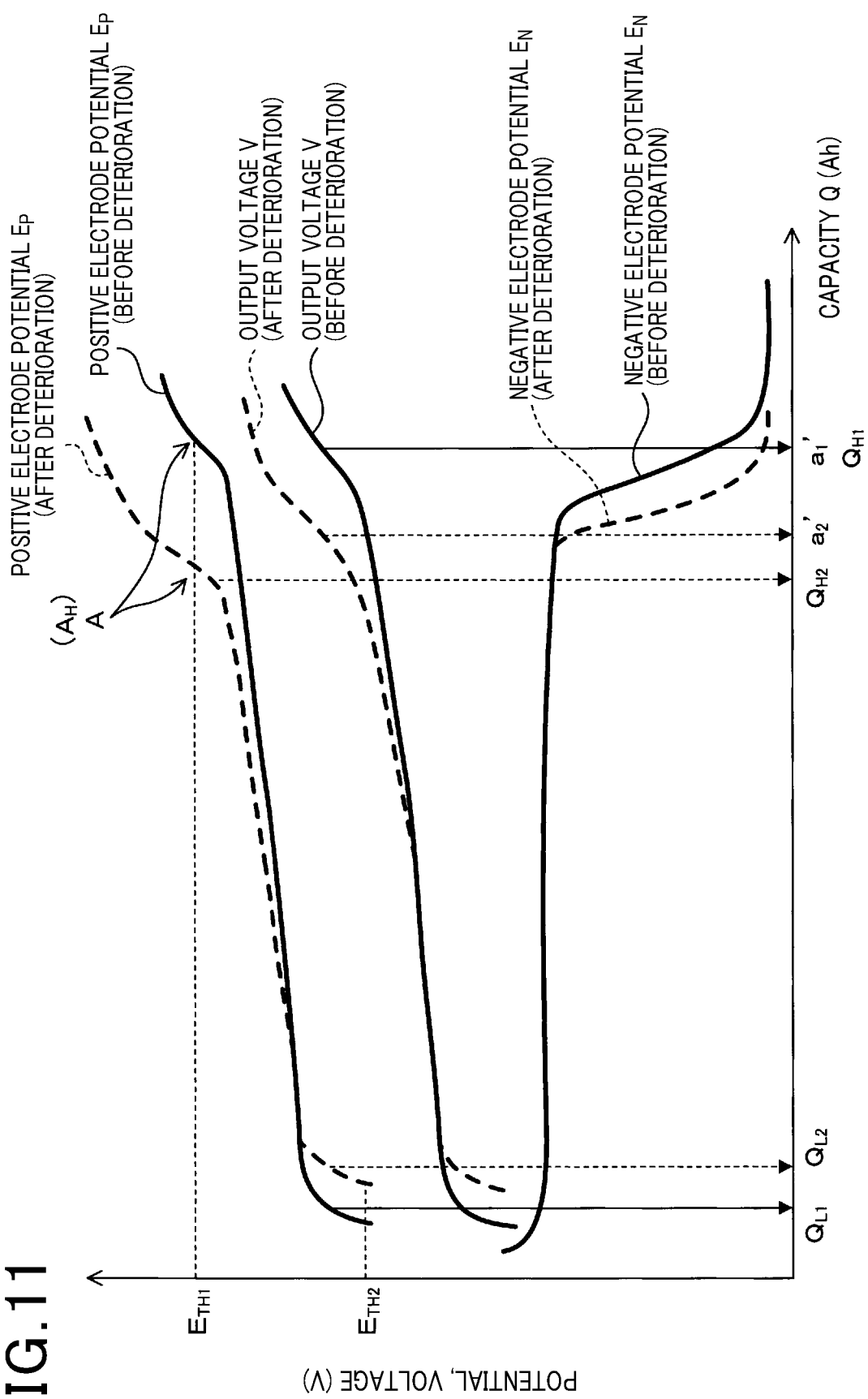
FIG. 11 is a graph showing a relationship between the positive electrode potential, the output voltage, the negative electrode potential, and the capacity before and after the deterioration of the secondary battery according to a sixth embodiment.

As shown in FIG. 11, before the secondary battery 2 is deteriorated, the capacity Q (i.e., singular point capacity a') corresponding to the singular point $A_H$ is a relatively high value a1'. When the secondary battery 2 is deteriorated, the singular point capacity a' is changed to a low value a2'. The control section 3 of the present embodiment stores in advance, as a map, a relationship of a value of the singular point capacity a2' after the deterioration with the upper limit value $Q_{H2}$ and the lower limit value $Q_{L2}$. By using the map, the control section 3 calculates the upper limit value $Q_{H2}$ and the lower limit value $Q_{L2}$ after the deterioration. Thus, the control section 3 prevents the positive electrode potential $E_P$ from deviating from the predetermined range of $E_{TH1}$ to $E_{TH2}$.

Figure 12:
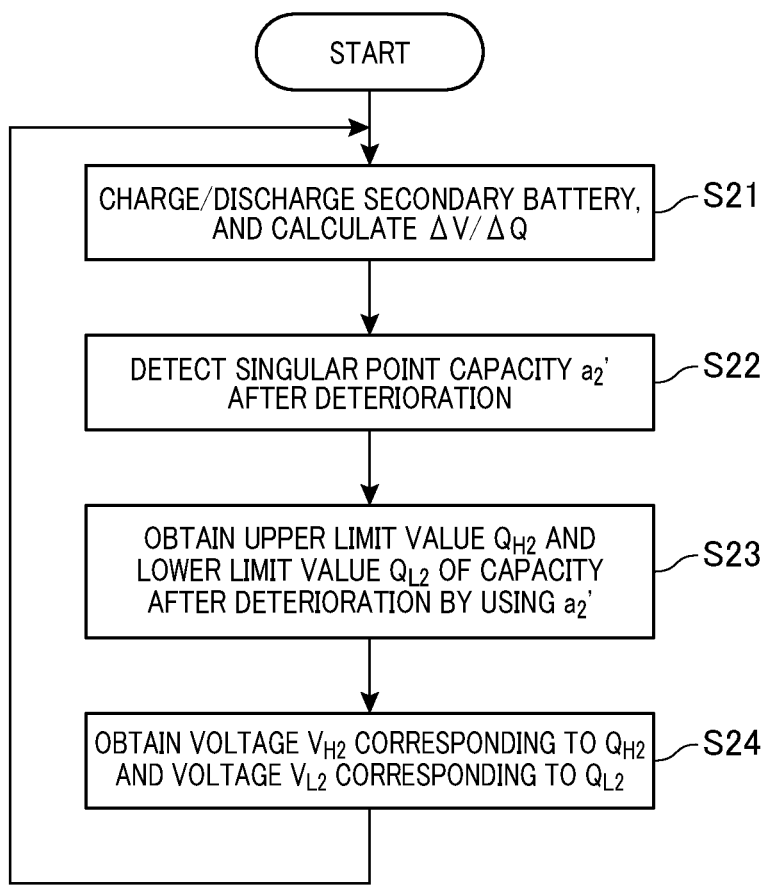
FIG. 12 is a flow chart for the control section according to the sixth embodiment 6.

Next, a flow chart for the control section 3 will be described. As shown in FIG. 12, first, the control section 3 performs step S21. At this step, the secondary battery 2 is charged/discharged, and $\Delta V/\Delta Q$ is calculated. Then, the control proceeds to step S22. At this step, the singular point capacity a2' after the deterioration is detected.

Next, the control proceeds to step S23. At this step, by using the singular point capacity a2' after the deterioration, the upper limit value $Q_{H2}$ and the lower limit value $Q_{L2}$ of the capacity Q after the deterioration are obtained. Then, the control proceeds to step S24. At this step, an output voltage $V_{H2}$ corresponding to the upper limit value $Q_{H2}$ and an output voltage $V_{L2}$ corresponding to the lower limit value $Q_{L2}$ are obtained.

In addition, the present embodiment has the same configuration and effects as those of the first embodiment.

The present disclosure has been described on the basis of the embodiments, but it is understood that the present disclosure is not limited to the embodiments or the structures. The present disclosure includes various modified examples and modifications within an equivalent range. In addition, a category or range of thought of the present disclosure encompasses various combinations or forms and other combinations or forms including only one element, one or more elements, or one or less elements of those.

An aspect of the present disclosure is a power supply system (1) including: a secondary battery (2); and a control section (3) that controls charging/discharging of the secondary battery, wherein: the secondary battery includes a pair of electrodes (4) which are a positive electrode ($4_P$) and a negative electrode ($4_N$) each having an active material (40), and is configured to output, as an output voltage (V), a difference between a potential ($E_P$) of the positive electrode and a potential ($E_N$) of the negative electrode, metal atoms being detached from/inserted into the active material; the electrode has a singular point (A) at which a variation ($\Delta V/\Delta Q$) in the output voltage with respect to a capacity (Q) of the secondary battery is singularly changed; and the control section includes a detection section (31) that detects a singular point capacity (a, b) by changing the capacity of the secondary battery and measuring a change in the output voltage, the singular point capacity being the capacity at which the singular point appears, and a calculation setting section (32) that, when the secondary battery is deteriorated, calculates and sets at least one of an upper limit value ($Q_H$) and a lower limit value ($Q_L$) of the capacity by using a detection value of the singular point capacity after the deterioration so that the potential of the electrode does not deviate from a predetermined range ($E_{TH1}$ to $E_{TH2}$).

The control section of the power supply system includes the detection section and the calculation setting section.

Thus, progression of the deterioration of the secondary battery can be effectively prevented. Specifically, the electrode of the power supply system has the singular point. Furthermore, the control section is capable of detecting the singular point capacity which is the capacity at which the singular point appears. When the electrode is deteriorated, a value of the singular point capacity is changed (see FIG. 1). Accordingly, the singular point capacity can be used as an indicator of a degree of the deterioration of the electrode. By using the singular point capacity, therefore, the upper limit value and the lower limit value of the capacity of the secondary battery can be set to optimum values according to the degree of the deterioration of the electrode. This makes it possible to prevent the potential of the deteriorated electrode from deviating from the predetermined range and prevent progression of the deterioration of the secondary battery.

As has been described, the aspect can provide a power supply system more capable of preventing progression of deterioration of a secondary battery.

The "capacity" of the secondary battery means a charge capacity or a discharge capacity of the secondary battery. Furthermore, a position of the singular point can be indicated by a charge amount or a discharge amount. As an indicator, a charge capacity, a discharge capacity, a state of charge (SOC), a depth of discharge (DOD), or a voltage can be used. Furthermore, the upper limit value of the capacity of the secondary battery means an upper limit value of a capacity stored in the battery, and the lower limit value of the capacity of the secondary battery means an lower limit value of the capacity stored in the battery. Similarly, as an indicator, a charge capacity, a discharge capacity, a state of charge (SOC), a depth of discharge (DOD), or a voltage can be used.

What is claimed is:

1. A power supply system comprising:
a secondary battery; and
a control section that controls charging/discharging of the secondary battery, wherein
the secondary battery includes a pair of electrodes which are a positive electrode and a negative electrode each having an active material, and is configured to output, as an output voltage, a difference between a potential of the positive electrode and a potential of the negative electrode, metal atoms being detached from/inserted into the active material,
the electrode has a singular point at which a variation in the output voltage with respect to a capacity of the secondary battery is singularly changed; and
the control section includes
a detection section that detects a singular point capacity by changing the capacity of the secondary battery and measuring a change in the output voltage, the singular point capacity being the capacity at which the singular point appears, and
a calculation setting section that, when the secondary battery is deteriorated, calculates and sets at least one of an upper limit value and a lower limit value of the capacity by using a detection value of the singular point capacity after the deterioration so that the potential of the electrode does not deviate from a predetermined range.

2. The power supply system according to claim 1, wherein the control section is configured to determine, as the singular point, a state where the variation in the output voltage with respect to the capacity of the secondary battery is higher than a predetermined value.

3. The power supply system according to claim 2, wherein
one of the pair of electrodes is a high deterioration rate electrode that has a higher deterioration rate than the other electrode, and
the high deterioration rate electrode has a center singular point which is the singular point that is present between two non-singular regions in which the variation is smaller than a predetermined value.

4. The power supply system according to claim 3, wherein:
the high deterioration rate electrode has the center singular point and a low side singular point which is the singular point that appears when the capacity is lower than the center singular point; and
the control section is configured to, by using the singular point capacity $a_1$ corresponding to the low side singular point, the singular point capacity $b_1$ corresponding to the center singular point, and the upper limit value $Q_{H1}$ and the lower limit value $Q_{L1}$ before the secondary battery is deteriorated, and the singular point capacity $a_2$ corresponding to the low side singular point and the singular point capacity $b_2$ corresponding to the center singular point after the deterioration, calculate the upper limit value $Q_{H2}$ and the lower limit value $Q_{L2}$ after the deterioration by the following equations:

$Q_{H2}=(b_2-a_2)/(b_1-a_1)\times(Q_{H1}-b_1)+b_2$; and $Q_{L2}=(b_2-a_2)/(b_1-a_1)\times(Q_{H1}-a_1)+a_2$.

5. The power supply system according to claim 4, wherein the control section is configured to calculate a difference between the singular point capacity corresponding to the center singular point and the singular point capacity corresponding to the low side singular point and calculate the upper limit value and the lower limit value again when the difference is reduced by a predetermined value or more as compared with the time when the upper limit value and the lower limit value are previously calculated.

6. The power supply system according to claim 4, wherein the control section is configured to control charging/discharging of the secondary battery so that the output voltage is between a first voltage corresponding to the upper limit value and a second voltage corresponding to the lower limit value after the upper limit value and the lower limit value are calculated.

7. The power supply system according to claim 3, wherein the high deterioration rate electrode is formed by mixing a plurality of types of electrode materials.

8. The power supply system according to claim 3, wherein the secondary battery is a lithium ion secondary battery.

9. The power supply system according to claim 8, wherein
the high deterioration rate electrode is the positive electrode,
the positive electrode contains $Li_xMn_{2-z}Me_zO_4$ (z=0 to 0.5, Me is Li or transition metal, x=0 to 2); and
the negative electrode contains $Li_yTi_5O_{12}$ (y=4 to 7).

10. The power supply system according to claim 8, wherein
the high deterioration rate electrode is the negative electrode; and
the negative electrode contains graphite.

* * * * *